United States Patent
Lee

(10) Patent No.: US 6,291,865 B1
(45) Date of Patent: *Sep. 18, 2001

(54) SEMICONDUCTOR DEVICE HAVING IMPROVED ON-OFF CURRENT CHARACTERISTICS

(75) Inventor: Hyung Joo Lee, Kyungsangbuk-do (KR)

(73) Assignee: LG Semicon Co., Ltd., Chungcheongbuk-Do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/217,574

(22) Filed: Dec. 21, 1998

(30) Foreign Application Priority Data

Dec. 27, 1997 (KR) .................................... 97-75403

(51) Int. Cl.[7] ...................................... H01L 29/78
(52) U.S. Cl. ............................................ 257/410; 257/411
(58) Field of Search ................................... 257/402, 410, 257/411

(56) References Cited

U.S. PATENT DOCUMENTS 5,254,867 * 10/1993 Fukuda et al. ........................ 257/411
5,369,297 * 11/1994 Kusunoki et al. .................... 257/411
5,864,160 *  1/1999 Buynoski .............................. 257/410

* cited by examiner

Primary Examiner—Gene M. Munson
(74) Attorney, Agent, or Firm—Morgan, Lewis & Bockius LLP

(57) ABSTRACT

A semiconductor device and a method of fabricating the same are disclosed in the present invention. The semiconductor device includes a semiconductor substrate, first and second gate insulating layers on the semiconductor layer, the first and second insulating layer having different dielectric constants, and a gate electrode on the first and second gate insulating layers.

14 Claims, 6 Drawing Sheets

SEMICONDUCTOR DEVICE HAVING IMPROVED ON-OFF CURRENT CHARACTERISTICS

This application claims the benefit of Korean Application No. 97-75403 filed Dec. 27, 1997, which is hereby incorporated by reference.

BACKGROUND OF THE INVENTION

1. Field of the Invention

The present invention relates to a semiconductor device, and more particularly, to a semiconductor device and a method for fabricating the same. Although the present invention is suitable for a wide scope of applications, it is particularly suitable for improving characteristic of the device.

2. Discussion of the Related Art

A background art semiconductor device will be described with reference to the accompanying drawings.

FIG. 1A is a cross-sectional view illustrating a semiconductor device according to the background art. FIG. 1B is a cross-sectional view illustrating a pre-amorphijation (P-A) processed semiconductor device to have a small junction depth according to the background art. FIG. 1C is a cross-sectional view illustrating a semiconductor device having a Halo structure according to the background art.

Generally, a field effect transistor (FET) has a gate electrode formed on a gate insulator having the same dielectric constant in the overall region. As shown in FIG. 1, the FET according to background art includes a semiconductor substrate 1, a gate insulator 2, a gate electrode material layer 3, and source/drain regions 4a and 4b. The gate insulator 2 constituting one material layer which has a particular dielectric constant is formed on the semiconductor substrate 1. The gate electrode material layer 3 is formed on the gate insulator 3. The source/drain regions 4a and 4b are formed in a surface of the semiconductor substrate 1 at both sides of the gate electrode material layer 3.

In such a FET, a device is formed using the gate insulator 2 having a particular dielectric constant, and a channel inversion region is formed below the gate insulator 2 when a voltage is applied to the gate electrode, thereby moving carriers between the source/drain regions 4a and 4b.

Electrical characteristic of the FET can be defined as follows.

$$Id(sat)\ Cox=(\epsilon i.S)/Tox,$$

where, Id(sat) is a drain saturation current, Cox is a gate capacitance, $\epsilon i$ is a dielectric constant of the gate insulator, Tox is a gate thickness, and S is a cross-sectional area. Here, the dielectric constant of the gate insulator is obtained by multiplying a free space dielectric constant by a semiconductor specific inductive capacity.

A variable value of a threshold voltage is expressed as $\Delta V_T = (V_{T\,S.C} - V_{T\,L.C})\ 1/Cox = (Tox \times S)/\epsilon i$, where $V_{T\,S.C}$ is a threshold voltage of a short channel, $V_{T\,L.C}$ is a threshold voltage of a long channel, and 1/Cox is a serve threshold value factor.

To prevent damage of the device due to a short channel effect and a punchthrough in the above-described FET, semiconductor devices shown in FIGS. 1B and 1C have been suggested.

In FIG. 1B, P-A process is performed to realize a small junction depth in the surface of the semiconductor substrate 1 where the source/drain regions 4a and 4b will be formed. An ion-implantation process is formed thereafter, so that the device is formed to have the gate insulator 2 having one level of dielectric constant.

If a voltage is applied to the gate electrode material layer 3, an inversion layer is formed in a channel region below the gate insulator 2, thereby flowing a current between the source/drain regions 4a and 4b.

Before forming the source/drain regions 4a and 4b, the P-A process is performed to avoid an ion channeling. Therefore, the source/drain regions 4a and 4b are formed to have a small junction depth, thereby reducing a punchthrough.

In FIG. 1C, the FET having a Halo structure is demonstrated to eliminate a punchthrough. A short channel effect, which is undesirable to the device, occurs frequently as a channel length of a semiconductor device becomes shorter, especially in a metal oxide semiconductor field effect transistor (MOSFET). To solve such a problem, among various methods, there is a method for reducing a short channel effect by varying doping profile in a channel region using a Halo doping.

To form a Halo structure, a gate electrode material layer 3 is formed on the gate insulator 2 and impurity ions opposite to the source/drain regions are implanted into the semiconductor substrate at an angle of 0–45°. Alternatively, a gate sidewall spacer is formed and then impurity ions are tilted-implanted into the semiconductor substrate at an angle of 0–45°. In this process, B or $BF_2$ is used as the impurity ions for an n-MOS transistor.

In a transistor having such a Halo structure, a depletion region due to a drain bias is prevented from being expanded since a drain region is surrounded by a heavily doped region of a conductivity type opposite to the drain region. Thus, a punchthrough can be prevented from occurring in the short channel and drain induced barrier lowering (DIBL) can be reduced. Nonetheless, the aforementioned FET has several problems as follows.

In the background art FET, it is difficult to improve an on-off current characteristic and to reduce a short channel effect at the same time. Although the short channel effect can be reduced in the background art FET, there still remains a problem that a current is reduced as a resistance of source/drain increases.

Further, since a heavily doped region surrounds the source/drain region, a junction capacitance increases, thereby deteriorating characteristics of the device.

For the transistor of Halo structure, since a threshold voltage is varied depending on tilt-ion implantation, it is difficult to ensure a uniformity of the threshold voltage.

In particular, in reducing a thickness of the gate insulator to reduce a short channel effect, a gate breakdown, grid, and impurity scattering are caused, which deteriorate a current characteristic.

SUMMARY OF THE INVENTION

Accordingly, the present invention is directed to a semiconductor device and a method of fabricating the same that substantially obviate one or more of the problems due to limitations and disadvantages of the related art.

An object of the present invention is to provide a semiconductor device and a method of fabricating the same, in which gate insulators of material regions having different dielectric constants are formed and a gate is formed on the gate insulators to improve characteristics of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device includes a semiconductor substrate including a channel region, gate insulators of material layers having different dielectric constants on the channel region divided in longitudinal direction, a gate electrode formed on the gate insulating layers, and source/drain regions formed in a surface of the semiconductor substrate at both sides of the gate electrode.

In another aspect, a method for fabricating a semiconductor device according to the present invention includes the steps of forming a first gate insulator having a first dielectric constant $\epsilon 1$ on a semiconductor substrate, patterning the first gate insulator to remain in a source region on a channel region, forming a second gate insulator having a second dielectric constant $\epsilon 2$ on an exposed surface of the semiconductor substrate in a drain region on the channel region, depositing a material layer for gate electrode on the semiconductor substrate in which the first and second gate insulators are formed, forming a gate electrode layer by patterning the material layer to remain on the channel region, and implanting impurity ions into a surface at both sides of the semiconductor substrate using the gate electrode layer as a mask to form source/drain regions.

In another aspect of the present invention, a semiconductor device includes a semiconductor substrate, first and second gate insulating layers on the semiconductor layer, the first and second insulating layer having different dielectric constants, and a gate electrode on the first and second gate insulating layers.

In another aspect of the present invention, a semiconductor device includes a semiconductor substrate, first, second, and third gate insulating layers on the semiconductor layer, the first gate insulating layer and the third gate insulator having the same dielectric constant, and a gate electrode on the first and second gate insulating layers including the third gate insulating layer.

In another aspect of the present invention, a semiconductor device includes a semiconductor substrate, a channel region in the semiconductor substrate, first and third gate insulating layers over the channel region, a second gate insulating layer over the channel region between the first and third gate insulating layers, a gate electrode on the first, second, and third gate insulating layers, and source/drain regions in the semiconductor substrate at both sides of the gate electrode.

In another aspect of the present invention, a method of fabricating a semiconductor device having a substrate includes the steps of forming a first gate insulating layer on the substrate, forming a second gate insulating layer on the substrate, forming a gate electrode on the first and second gate insulating layers, and forming source/drain regions in the substrate at both sides of the gate electrode, thereby defining a channel region.

In a further aspect of the present invention, a method of fabricating a semiconductor device having a substrate includes the steps of forming first and third gate insulating layers having a first dielectric constant on the substrate, forming a second gate insulating layer having a second dielectric constant in the substrate between the first and third gate insulating layers, forming a gate electrode on the first, second, and third gate insulating layers, and forming source/drain regions at both sides of the gate electrode, thereby defining a channel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1A:
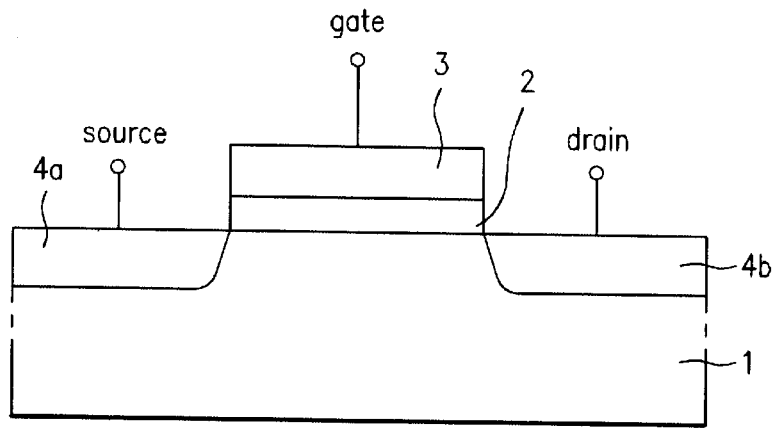
FIG. 1a is a cross-sectional view illustrating a semiconductor device according to a background art.
Figure 1B:
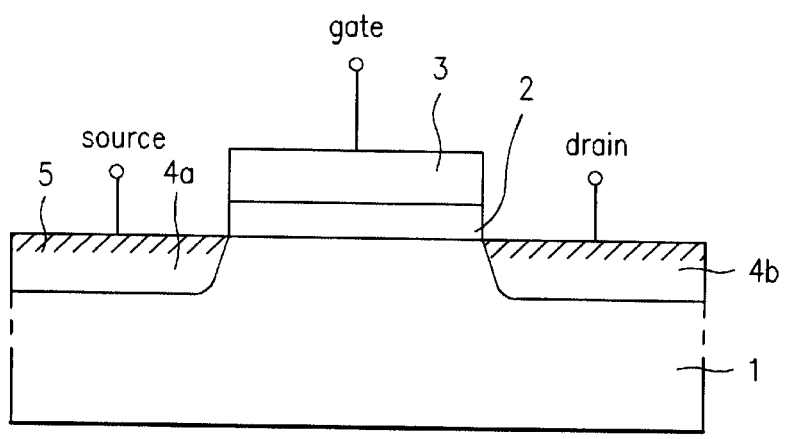
FIG. 1b is a cross-sectional view illustrating the background art pre-amorphijation(P-A) processed semiconductor device for a small junction depth.
Figure 1C:
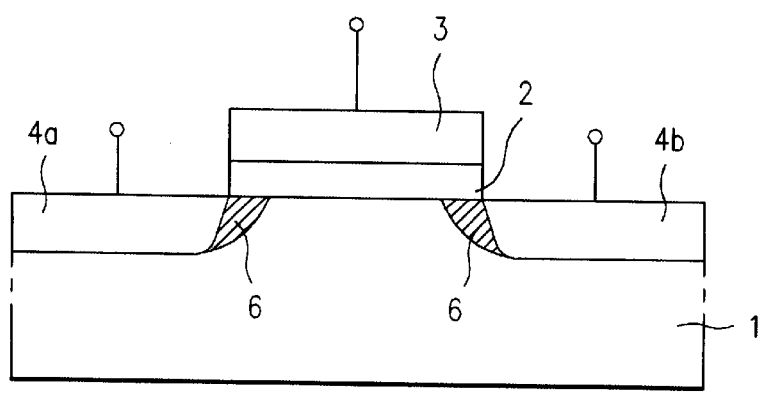
FIG. 1c is a cross-sectional view illustrating a background art semiconductor device having a Halo structure.

Reference will now be made in detail to the preferred embodiments of the present invention, examples of which are illustrated in the accompanying drawings.

In a semiconductor device according to the present invention, gate insulators of material layers having different dielectric constants are formed and a gate is formed on the gate insulators.

The semiconductor device according to a first embodiment of the present invention includes a semiconductor substrate 20, a first gate insulator 21, a second gate insulator 22, a gate electrode layer 24, and source/drain regions 25a and 25b. The first gate insulator 21 and the second gate insulator 22 are formed of material layers having dielectric constants different from each other on a semiconductor substrate 20. The gate electrode layer 24 is formed on the first gate insulator 21 including the second gate insulator 22. The source/drain regions 25a and 25b are formed in a surface of the semiconductor substrate 20 at both sides of the gate electrode layer 24.

The semiconductor device of the present invention constitutes a field effect transistor (FET) which moves a carrier between the source and the drain by forming a channel inversion region below the first and second gate insulators when a voltage is applied to a gate electrode.

In the first embodiment of the present invention, the gate electrode 24 is divided into two material layers, which are the first and second gate insulators 21 and 22 having dielectric constants different from each other. The second gate insulator 22 in the drain region is wider than the first gate insulator 21.

Figure 2A:
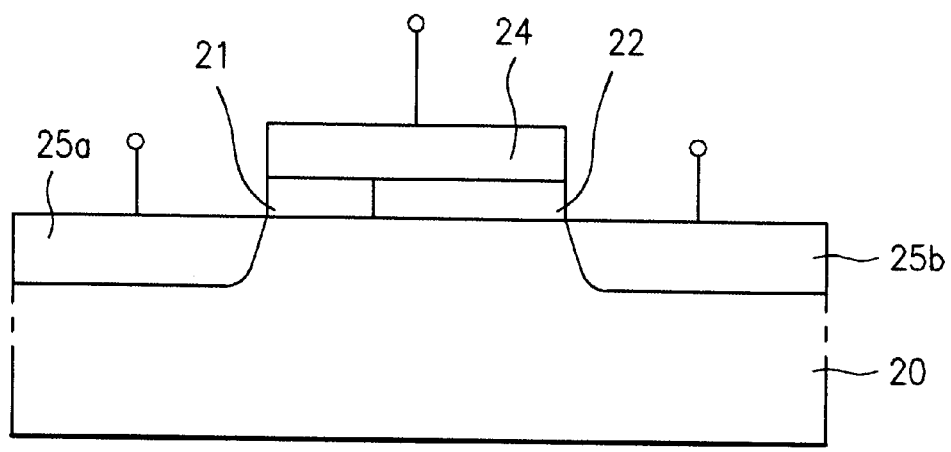
FIG. 2a is a cross-sectional view illustrating a semiconductor device according to a first embodiment of the present invention.
Figure 2B:
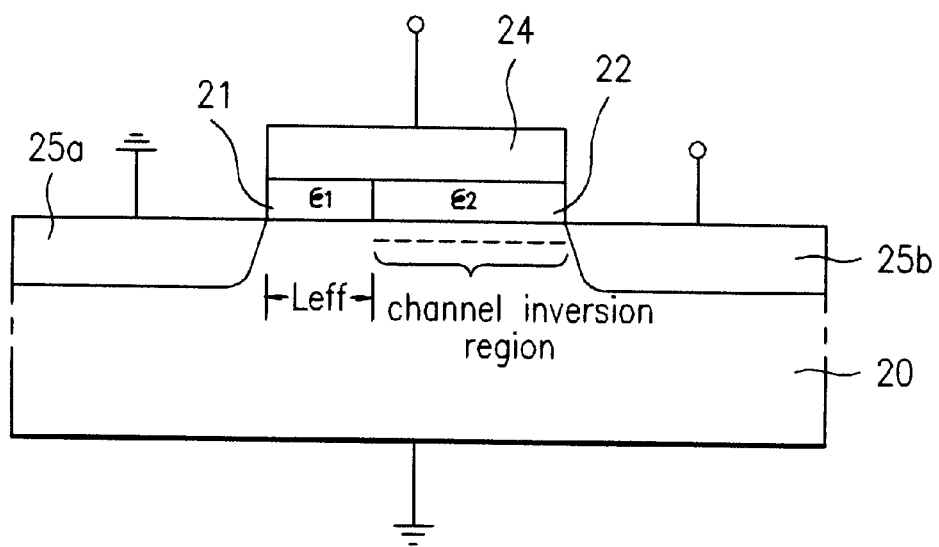
FIG. 2b is a cross-sectional view illustrating an inversion layer in accordance with first and second dielectric constants of gate insulators of FIG. 2A.

In the FET of the present invention, if a voltage is applied to the gate electrode layer 24, the inversion layer is formed in the channel region of the semiconductor substrate 20 below the gate electrode layer 24 to flow a current of the source to the drain. The inversion layer is formed as shown in FIG. 2B by the first and second gate insulators 21 and 22 having dielectric constants different from each other.

If the dielectric constant $\epsilon 2$ of the second gate insulator 22 is greater than the dielectric constant $\epsilon 1$ of the first gate insulator 21, the inversion layer is first formed below the second gate insulator 22 having higher dielectric constant. A threshold voltage Vt and an effective channel length Leff are determined by the first gate insulator 22 of low dielectric constant (Vt 1/Ci).

Figure 2C:
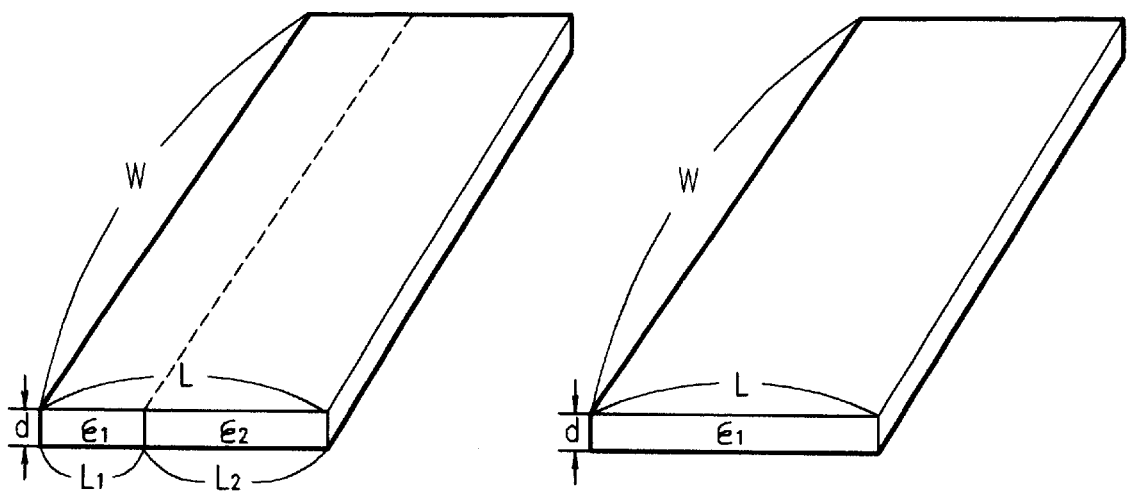
FIG. 2c is a cross-sectional view illustrating a gate capacitance in accordance with first and second dielectric constants of gate insulators of FIG. 2A.

FIG. 2C shows a gate capacitance in both a gate insulator having combined dielectric constants and a gate insulator having a single dielectric constant.

In the gate insulator having combined dielectric constants, a gate capacitance is as follows.

$$Ci = \frac{\epsilon 1 W}{d}\left(L1 + \frac{\epsilon 2}{\epsilon 1}L2\right)$$

In the gate insulator having a single dielectric constant, a gate capacitance is as follows.

$$Ci' = \frac{\epsilon 1 W}{d}(L1 + L2)$$

In this case, if the dielectric constant is $\epsilon 1 > \epsilon 2$, in integrated gate capacitance is Ci>Ci'.

A method of fabricating the FET according to the first embodiment of the present invention will be described with reference to FIGS. 3A to 3C.

In the method of fabricating the FET according to the first embodiment of the present invention, the gate electrode is divided into at least one regions to form gate insulators having different dielectric constants.

Figure 3A:
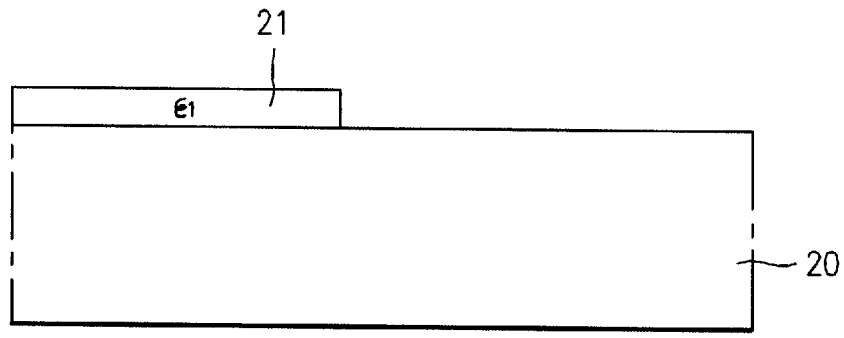
FIGS. 3a to 3c are cross-sectional views illustrating the process steps of fabricating method of a semiconductor device according to the first embodiment of the present invention.

As shown in FIG. 3A, the first gate insulator 21 having the first dielectric constant $\epsilon 1$ is formed on the semiconductor substrate 20 toward the source on the channel region. A width of the first gate insulator 21 on the channel region is smaller than an half of the overall channel region.

Figure 3B:
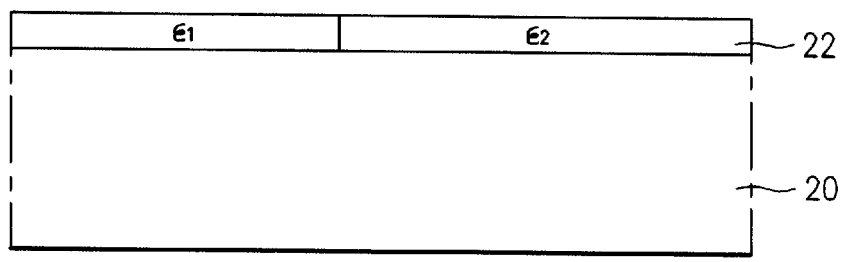

As shown in FIG. 3B, the second gate insulator 22 having the second dielectric constant $\epsilon 2$ is formed on the semiconductor substrate 20 toward the drain on the channel region. A width of the second gate insulator 22 is greater than an half of the overall channel region.

Figure 3C:
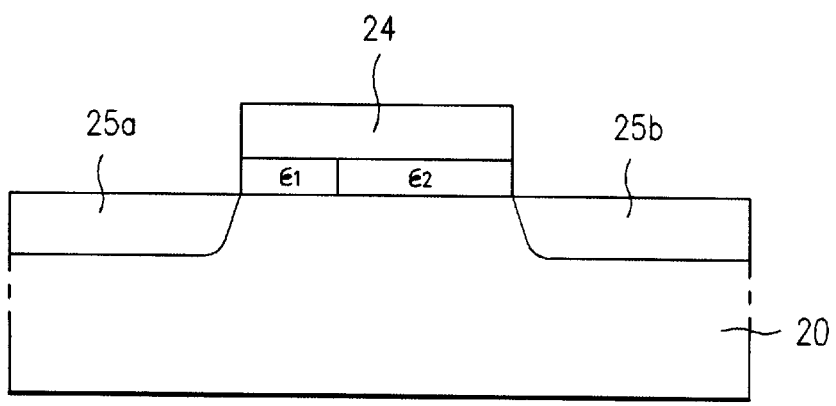

Subsequently, as shown in FIG. 3C, a gate electrode material layer is deposited on the semiconductor substrate 20 in which the first and second gate insulators 21 and 22 are formed. The material layer is then patterned to form a gate electrode layer 24 on the channel region. Impurity ions are implanted into the surface at both sides of the semiconductor substrate 20 using the gate electrode layer 24 as a mask to form source/drain regions 25a and 25b. For example, when $Si_3N_4$ is used as the first gate insulator 21, $SiO_2$ having a dielectric constant different from $Si_3N_4$ may be used as the second gate insulator 22.

In a second embodiment of the present invention, the channel region is divided into at least three regions to form the gate insulators.

The FET according to the second embodiment of the present invention will be described as follows.

Figure 4:
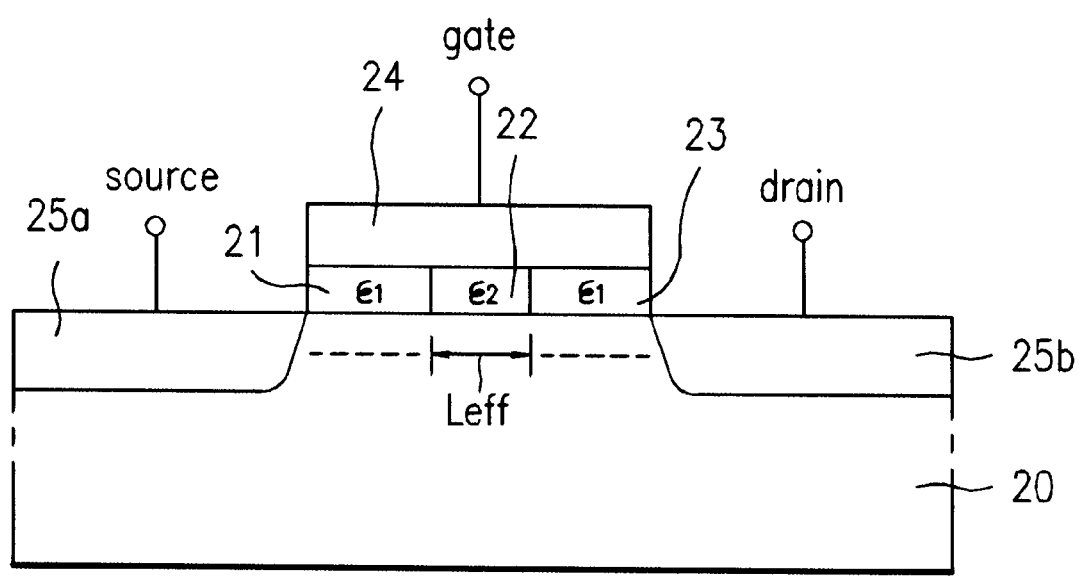
FIG. 4 is a cross-sectional view illustrating a semiconductor device according to a second embodiment of the present invention.
Figure 5A:
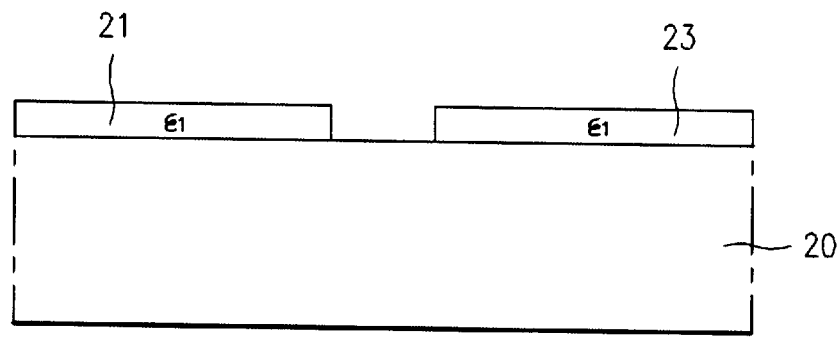
FIGS. 5a to 5c are cross-sectional views illustrating the process steps of fabricating method of a semiconductor device according to the second embodiment of the present invention.
Figure 5B:
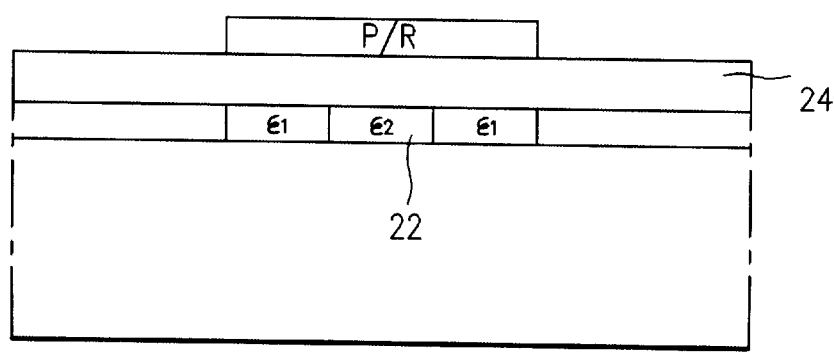
Figure 5C:
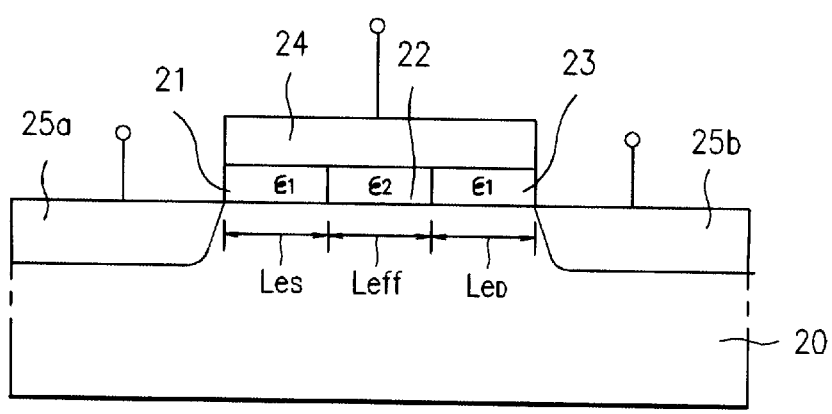

FIG. 4 is a cross-sectional view illustrating a semiconductor device according to the second embodiment of the present invention. FIGS. 5A to 5C are cross-sectional views illustrating the process steps of fabricating method for a semiconductor device according to the second embodiment of the present invention.

The semiconductor device according to the second embodiment of the present invention includes a semiconductor substrate 20, a first gate insulator 21, a second gate insulator 22, a third gate insulator 23, a gate electrode layer 24, and source/drain regions 25a and 25b. The first gate insulator 21 and the second gate insulator 22 have dielectric constants different from each other. The third gate insulator 23 has the same dielectric constant as the dielectric constant of the first gate insulator 21. The gate electrode layer 24 is formed on the first gate insulator 21, the second gate insulator 22, and the third gate insulator 23. The source/drain regions 25a and 25b are formed in the semiconductor substrate 20 at both sides of the gate electrode layer 24.

If a voltage is applied to the gate electrode layer 24, an inversion layer is formed below the first and third gate insulators 21 and 23 having a higher dielectric constant. The threshold voltage is proportional to $dS/\epsilon$ (where d is a thickness of the gate electrode, and S is a cross-sectional area of the gate electrode).

Since the gate insulators having dielectric constants $\epsilon 1$ and $\epsilon 2$ ($\epsilon 1 > \epsilon 2$) are formed below the gate electrode layer 24, an actual effective gate length is determined by a length below the second gate insulator 22 having the dielectric constant $\epsilon 2$. Effective source/drain regions are formed by the inversion layer below the first and third gate insulators 21 and 23 having the dielectric constant $\epsilon 1$.

A method of fabricating the FET according to the second embodiment of the present invention will be described with reference to FIGS. 5A to 5C.

As shown in FIG. 5A, the first and third gate insulators 21 and 23 having a first dielectric constant $\epsilon 1$ are formed on the semiconductor substrate 20. A width of the first gate insulator 21 will be one about third of the overall channel region. The third gate insulator 23 has a width the same as the first gate insulator 21.

As shown in FIG. 5B, the second gate insulator 22 having a second dielectric constant $\epsilon 2$ is formed on an exposed surface of the semiconductor substrate 20 in the center portion of the channel region. A width of the second gate insulator 22 will be about one third of the overall channel region.

Subsequently, as shown in FIG. 5C, a gate electrode material layer is formed on the semiconductor substrate 20 in which the first, second, and third gate insulators 21, 22, and 23 are formed. The material layer is then patterned to form the gate electrode layer 24 on the channel region. Impurity ions are then implanted into the surface at both sides of the semiconductor substrate 20 using the gate electrode layer 24 as a mask to form source/drain regions 25a and 25b. In case that $Si_3N_4$ is used as the first gate insulator 21, $SiO_2$ having a dielectric constant different from $Si_3N_4$ is used as the second gate insulator 22.

In the FET according to the second embodiment of the present invention, the gate electrode layer 24 is divided into three regions to form first, second, and third gate insulators 21, 22, and 23. The gate electrode layer 24 includes two material layers having different dielectric constants.

If a voltage is applied to the gate electrode layer 24, an inversion layer is formed in the channel region of the semiconductor substrate 20 below the gate electrode layer 24 to transfer a current of the source region to the drain region. The inversion layer is formed by the first, second and third gate insulators 21, 22, and 23.

Since the dielectric constant $\epsilon 1$ of the first and third gate insulators 21 and 23 is greater than the dielectric constant $\epsilon 2$ of the second gate insulator 22, the inversion layer is formed below the first and third gate insulator 21 and 23 having a higher dielectric constant. The threshold voltage Vt and the effective channel length Leff are determined by the second gate insulator 22 having a low dielectric constant.

As aforementioned, in the semiconductor device of the present invention, the gate is divided into at least two regions to form gate insulating layers having different dielectric constants.

The semiconductor device of the present invention has the following advantages.

In the semiconductor device of the present invention, a gate capacitance in the gate insulator of combined dielectric constants is $$Ci = \frac{\varepsilon 1 W}{d}\left(L1 + \frac{\varepsilon 2}{\varepsilon 1}L2\right),$$

and the gate capacitance in the gate insulator having a single dielectric constant is $$Ci' = \frac{\varepsilon 1 W}{d}(L1 + L2)$$

If $\epsilon 1 > \epsilon 2$, an integrated gate capacitance, Ci is larger than Ci'. Thus, by increasing Ci, a current characteristic is improved, and a short channel effect is prevented.

Further, since the gate insulators have different dielectric constants, the effective channel length is reduced, so that a high speed operation is realized by a ballistic transport effect without a scattering.

Particularly, a device having a small junction depth is realized as described in the second embodiment of the present invention. Therefore, a punchthrough characteristic, which causes in the short channel of the device, is much improved and a gate capacitance can be increased. As a result, a current characteristic is also improved in the device operation.

It will be apparent to those skilled in the art that various modifications and variations can be made in the semiconductor device and the method for fabricating the same according to the present invention without departing from the spirit or scope of the invention. Thus, it is intended that the present invention covers the modifications and variations of the invention provided they come within the scope of the appended claims and their equivalents.

What is claimed is:

1. A semiconductor device comprising:
   a semiconductor substrate;
   first and second gate insulating layers directly on the semiconductor substrate, the first and second insulating layers having different dielectric constants;
   a gate electrode on the first and second gate insulating layers; and
   doped regions formed in the semiconductor substrate at both sides of the gate electrode, wherein the doped regions do not substantially overlap the first and second gate insulating layers,
   wherein the first insulating layer includes an oxide, and the second insulating layer includes a nitride but no oxide.

2. The semiconductor device according to claim 1, wherein the second gate insulating layer has a length greater than the first gate insulating layer.

3. The semiconductor device according to claim 1, wherein the second gate insulating layer has a dielectric constant greater than the first gate insulating layer.

4. The semiconductor device according to claim 3, wherein the semiconductor device has a channel inversion region below the second gate insulating layer, the channel inversion region having a length substantially the same as the second gate insulating layer.

5. The semiconductor device according to claim 3, wherein the semiconductor device has an effective channel length below the first gate insulating layer, the effective channel length having a length substantially the same as the first gate insulating layer.

6. A semiconductor device comprising:
   a semiconductor substrate;
   first and second gate insulating layers on the semiconductor substrate, the first and second insulating layers having different dielectric constants; and
   a gate electrode on the first and second gate insulating layers,
   wherein the first and second gate insulating layers include $Si_3N_4$ and $SiO_2$, respectively.

7. A semiconductor device comprising:
   a semiconductor substrate;
   first, second, and third gate insulating layers directly on the semiconductor substrate, the first gate insulating layer and the second gate insulating layer having different dielectric constants, wherein the second insulating layer includes an oxide, and the first and third insulating layers include a nitride but no oxide;
   a gate electrode on the first and second gate insulating layers including the third gate insulating layer; and
   doped regions formed in the semiconductor substrate at both sides of the gate electrode, wherein the doped regions do not substantially overlap the first, second, and third gate insulating layers.

8. The semiconductor device according to claim 7, wherein a dielectric constant of the first and third gate insulating layers is greater than that of the second gate insulating layer.

9. The semiconductor device according to claim 7, wherein the semiconductor device has channel inversion regions below the first and third gate insulating layers, the channel inversion regions having a length substantially the same as the first and third gate insulating layers.

10. The semiconductor device according to claim 7, wherein the semiconductor device has an effective channel length below the second gate insulating layer, the effective channel length having a length substantially the same as the second gate insulating layer.

11. A semiconductor device, comprising:

a semiconductor substrate;

first, second, and third gate insulating layers on the semiconductor substrate, the first gate insulating layer and the second gate insulating layer having different dielectric constants; and a gate electrode on the first, second, and third gate insulating layers, wherein the first and second gate insulating layers include $Si_3N_4$ and $SiO_2$, respectively.

12. A semiconductor device comprising:

a semiconductor substrate a channel region in the semiconductor substrate;

first and third gate insulating layers directly on the channel region and both including a nitride but no oxide;

a second gate insulating layer over the channel region between the first and third gate insulating layers and including an oxide, wherein the first gate insulating layer and the second gate insulating layer have different dielectric constants;

a gate electrode on the first, second, and third gate insulating layers; and source/drain regions in the semiconductor substrate at both sides of the gate electrode, wherein the source/drain regions do not substantially overlap the first, second, and third gate insulating layers.

13. The semiconductor device according to claim 12, wherein the first gate insulating layer and the third gate insulating layer have the same dielectric constant.

14. The semiconductor device according to claim 12, wherein a dielectric constant of the first and third gate insulating layers is greater than that of the second gate insulating layer.

* * * * *